(12) United States Patent  (10) Patent No.: US 7,843,735 B2
Aritome  (45) Date of Patent: Nov. 30, 2010

(54) SENSING MEMORY CELLS

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 427 days.

(21) Appl. No.: 11/931,763

(22) Filed: Oct. 31, 2007

(65) Prior Publication Data

US 2009/0109744 A1 Apr. 30, 2009

(51) Int. Cl.
G11C 16/04 (2006.01)

(52) U.S. Cl. .............................. 365/185.17; 365/185.03; 365/185.21; 365/185.33

(58) Field of Classification Search ............ 365/185.03, 365/185.21, 185.17, 185.28, 185.33
See application file for complete search history.

(56) References Cited

U.S. PATENT DOCUMENTS

| 6,236,594 B1* | 5/2001 | Kwon ..................... 365/185.11 |
| 6,587,372 B2 | 7/2003 | Blodgett |
| 6,731,540 B2* | 5/2004 | Lee et al. ............... 365/185.17 |
| 6,807,610 B2 | 10/2004 | Frayer |
| 7,239,556 B2* | 7/2007 | Abe et al. .............. 365/185.33 |
| 7,567,455 B2* | 7/2009 | Khaef ..................... 365/185.02 |
| 2006/0028877 A1 | 2/2006 | Meir |

* cited by examiner

Primary Examiner—Pho M Luu
(74) Attorney, Agent, or Firm—Brooks, Cameron & Huebsch, PLLC

(57) ABSTRACT

Methods, devices, modules, and systems for operating memory cells are taught. A method for operating memory cells includes programming at least one of the memory cells to one of a number of states. The method also includes programming at least another one of the memory cells, which is adjacent to the programmed at least one of the memory cells, to one of a different number of states. The method further includes sensing non-erased states of the memory cell's using at least one common voltage level.

24 Claims, 4 Drawing Sheets

SENSING MEMORY CELLS

TECHNICAL FIELD

The present disclosure relates generally to semiconductor devices and, more particularly, in one or more embodiments, to sensing non-volatile multilevel memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to select lines. However each memory cell is not directly coupled to a column sense line by its drain. Instead, the memory cells of the array are coupled together in series, source to drain, between a source line and a column sense line.

Memory cells in a NAND array architecture can be programmed to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multi-digit cells, or multilevel cells (MLCs). MLCs can allow the manufacture of higher density memories without increasing the number of memory cells since each cell can represent more than one digit, e.g., bit. MLCs can have more than one programmed state, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

As NAND flash memory is scaled, parasitic capacitance coupling between adjacent memory cell floating gates becomes a problem. That is, as the physical proximity of adjacent cells, e.g., adjacent floating gates, decreases the FG-FG interference effects increase. Floating gate-to-floating gate (FG-FG) interference can cause a wider threshold voltage (Vt) distribution when the distribution should be tighter. The wider distributions can result in a degraded programming performance as well as other problems.

These problems for single level cell (SLC) NAND arrays are even greater in a multiple level cell (MLC) NAND array. MLC memory stores multiple digits on each cell by using different threshold levels for each state that is stored. The difference between adjacent threshold voltage distributions may be very small as compared to an SLC memory device. Therefore, the effects of floating gate-to-floating gate coupling in an MLC device are greatly increased.

Some programming methods designed to combat coupling effects in MLC devices may collaterally cause read performance to be degraded when reading an MLC device. Some programming methods designed to combat coupling effects in MLC devices may collaterally require more complex read circuitry.

DETAILED DESCRIPTION

One or more embodiments of the present disclosure provide methods, devices, and systems for operating memory cells. One method embodiment includes programming at least one of the memory cells to one of a number of states. The method also includes programming at least another one of the memory cells, which is adjacent to the programmed at least one of the memory cells, to one of a different number of states. The method further includes sensing non-erased states of the memory cells using at least one common voltage level.

In the following detailed description of the present disclosure, reference is made to the accompanying drawings that form a part hereof, and in which is shown by way of illustration how some embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
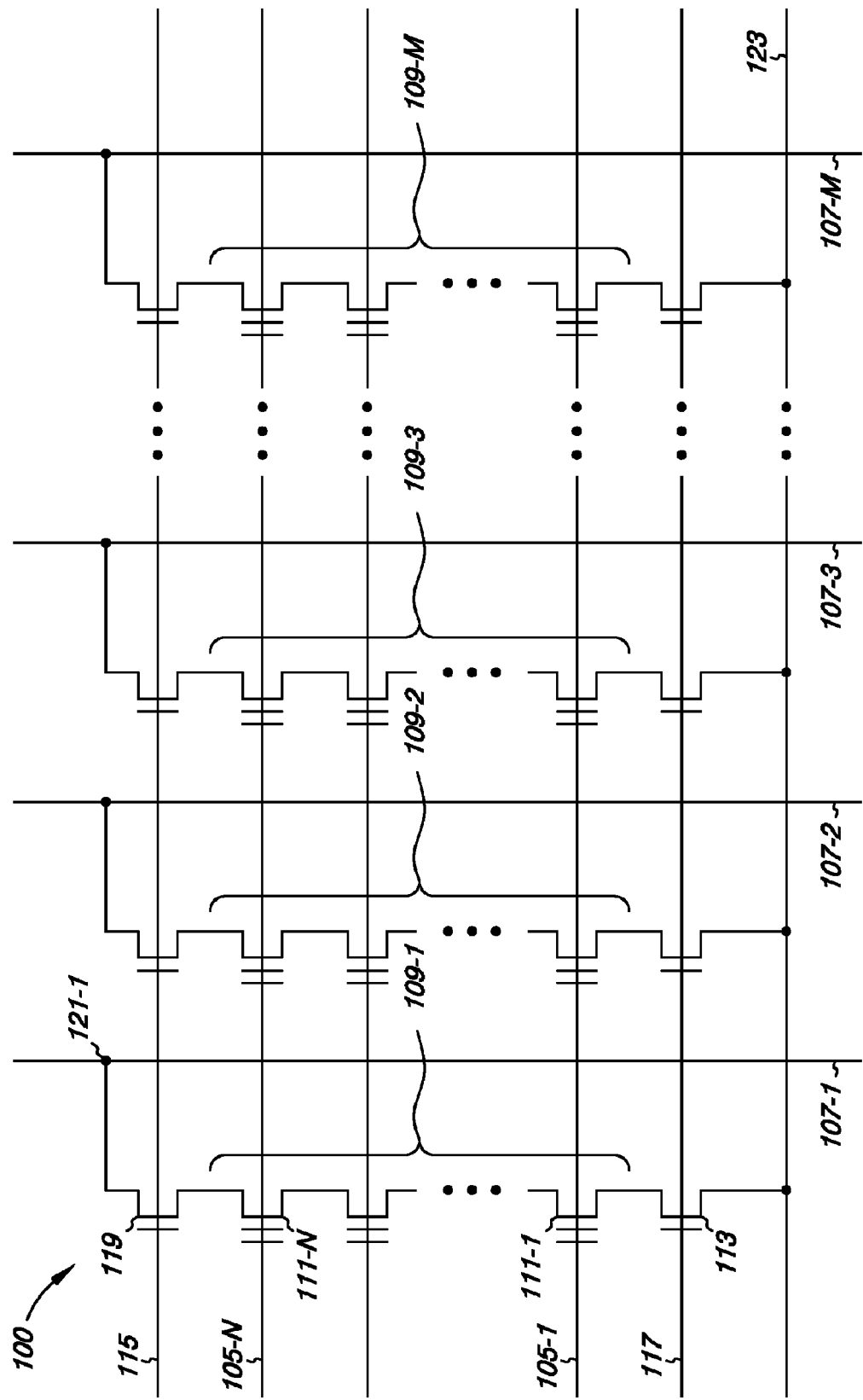
FIG. 1 is a schematic of a portion of a non-volatile memory array that can be used with embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are each some power of two, e.g., 256 select lines by 4,096 sense lines.

Memory array 100 includes NAND strings 109-1, . . . , 109-M. Each NAND string includes non-volatile memory cells 111-1, . . . , 111-N, each located at an intersection of a select line 105-1, . . . , 105-N and a local sense line 107-1, . . . 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In some embodiments, construction of non-volatile memory cells, 111-1, . . . , 111-N, includes a source, a drain, a floating gate or other charge storage layer, and a control gate. Non-volatile memory cells, 111-1, . . . , 111-N, have their control gates coupled to a select line, 105-1, . . . , 105-N respectively. A column of the non-volatile memory cells, 111-1, . . . , 111-N, make up the NAND strings, e.g., 109-1, . . . , 109-M, coupled to a given local sense line, e.g., 107-1, . . . , 107-M respectively. A row of the non-volatile memory cells are commonly coupled to a given select line, e.g., 105-1, . . . , 105-N. A NOR array architecture would be similarly laid out except that the string of memory cells would be coupled in parallel between the select gates.

As one of ordinary skill in the art will appreciate, subsets of cells coupled to a selected select line, e.g., 105-1, . . . , 105-N, can be programmed and/or sensed together as a group. A programming operation, e.g., a write operation, can include applying a number of program pulses, e.g., 16V-20V, to a selected select line in order to increase the threshold voltage (Vt) of selected cells to a desired program voltage level corresponding to a desired program state. A sensing operation, such as a read or program verify operation, can include sensing a voltage and/or current change of a sense line coupled to a selected cell in order to determine the state of the selected cell. The read and/or program verify operation can include applying a sensing voltage, e.g., 0V-5V, to a selected select line, while biasing the unselected cells of the string at a voltage, e.g., 5.5V, sufficient to place the unselected cells in a conducting state independent of the threshold voltage of the unselected cells. The sense line corresponding to the selected cell being read/verified can be sensed to determine whether or not the selected cell conducts in response to the particular sensing voltage applied to the selected select line.

In some instances, the sense lines 107-1, . . . , 107-M can be separated into even numbered sense lines and odd numbered sense lines. In such cases, and as described further in connection with FIGS. 2 and 3 below, cells corresponding to a selected select line and even numbered sense lines can be programmed together and referred to as an even logical page of data. Similarly, cells corresponding to the selected select line and odd numbered sense lines can be programmed together and referred to as an odd logical page of data. The cells coupled to alternating even numbered and odd numbered sense lines, e.g., an even page and an odd page, can be programmed and/or sensed at different times. For instance, even pages associated with selected select lines can be programmed and/or sensed before the odd pages associated with the selected select lines.

As one of ordinary skill in the art will appreciate, dividing select lines 105-1, . . . , 105-N, e.g., physical rows, into a number of logical pages that are programmed and/or sensed at separate times can provide shielding among adjacent sense lines, e.g., an adjacent even and odd sense line, which can reduce sense line coupling associated with read and/or program verify operations. Adjacent sense line coupling can produce voltage noise on sense lines which can lead to inaccurate read and/or verify operations.

However, programming adjacent memory cells at different times can lead to undesirable Vt shifts due to FG-FG interference effects. For instance, the Vt level of prior programmed cells, e.g., cells coupled to even sense lines, can be shifted from their desired programmed levels due to Vt increases of subsequently programmed adjacent cells, e.g., cells coupled to odd sense lines. The Vt level shifts of programmed cells due to FG-FG interference can lead to erroneous data reads. The undesirable FG-FG interference increases due to memory device scaling. That is, the FG-FG interference effects increase as the physical space between adjacent cells, e.g., adjacent floating gates, decreases.

Some programming methods designed to combat coupling effects may collaterally cause read performance to be degraded. If a number of cells on a select line have a greater number of digits, e.g., bits, than other cells, and are capable of being programmed to a greater number of program states, then more read cycles are required to read the cells as compared to select lines where all cells store the same number of digits and are capable of being programmed to the same number of program states. For example, if a number of cells on a select line are capable of being programmed to three states, and another number of cells on the same select line are capable of being programmed to six states, then a total of eight sense levels are required for that select line. As one of ordinary skill in the art will appreciate, an additional sensing voltage level to sense the uppermost state is unnecessary. Sensing all eight levels would require at least eight sensing cycles.

Some programming methods designed to combat coupling effects may collaterally require more complex sensing circuitry. In the example above, each additional read cycle requires additional programming for the non-volatile memory device to perform the required operations. Extra programming requires extra circuitry, thereby increasing the cost and size of the device.

As described in connection with FIGS. 2 and 3, some embodiments of the present disclosure can compensate for collateral read performance degradation. One or more embodiments can simplify the circuitry required to operate an array of memory cells programmed to compensate for FG-FG interference effects associated with cells storing varying numbers of digits per cell. Such simplification can be accomplished by using common sensing voltage levels to sense different program states for cells programmed to different numbers of program states. The number of sensing voltage levels, e.g., the number of sensing voltages, corresponds to the number of program states to which a given cell can be programmed. The number of programmed states, e.g., the number of different Vt levels to which a given cell can be programmed, corresponds to a number of digits for the memory cell. In some embodiments, the number of digits is a non-integer. That is, a particular cell can have a digit value which represents a non-integer number of digits, e.g., 1.5 digits, 2.5 digits, 3.5 digits, 4.5 digits, etc.

In some embodiments, the same sensing voltage level used to sense a lower program state for a cell having a lesser number of program states, is also used to sense a higher program state for a cell having a greater number of program states. Using common sensing voltage levels for different subsets of cells having different numbers of program states can improve sensing performance associated with an array of non-volatile multilevel memory cells, e.g., array 100 shown in FIG. 1, while allowing the reduction of adverse FG-FG interference effects associated with adjacent cells. Using common sensing voltage levels should improve sensing performance by reducing the total number of sensing voltage levels required to sense the array of cells, thereby reducing the number of sensing cycles required to sense the array of cells.

Figure 2A:
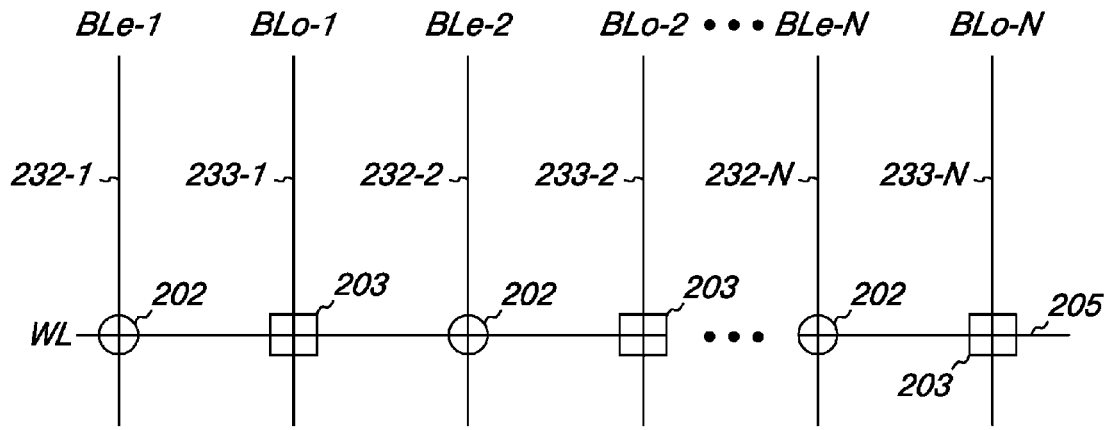
FIG. 2A illustrates a number of cells, having different numbers of digits, coupled to a select line in accordance with an embodiment of the present disclosure.

FIG. 2A illustrates a number of cells having different numbers of digits coupled to a select line in accordance with an embodiment of the present disclosure. The embodiment shown in FIG. 2A illustrates a number of cells 202/203 coupled to a select line, e.g., word line, (WL) 205. As shown in FIG. 2, the cells 202 are coupled to even numbered sense lines, e.g., bit lines, 232-1 (BLe-1), 232-2 (BLe-2), . . . , 232-N (BLe-N) and the cells 203 are coupled to odd numbered sense lines 233-1 (BLo-1), 233-2 (BLo-2), . . . , 233-N (BLo-N). That is, the cells 202 are interwoven with the cells 203 on alternating sense lines along select line 205. As the reader will appreciate, the sense lines can be coupled to sensing circuitry (not shown) that can be used to determine the Vt level of cells 202/203 during operation. Although only one select line 205 is illustrated in the embodiment of FIG. 2A, embodiments can include any number of select lines, e.g., select lines 105-1 to 105-N shown in FIG. 1.

In the embodiment of FIG. 2A, the even sense line cells 202 are programmed and sensed together as a group and correspond to an even page associated with select line 205. Similarly, the odd sense line cells 203 are programmed and sensed together as a group and correspond to an odd page associated with select line 205. That is, program operations, verify operations, and/or read operations can be performed on the even sense line cells 202 as a group and can be performed on the odd sense line cells 203 as a group.

Figure 2B:
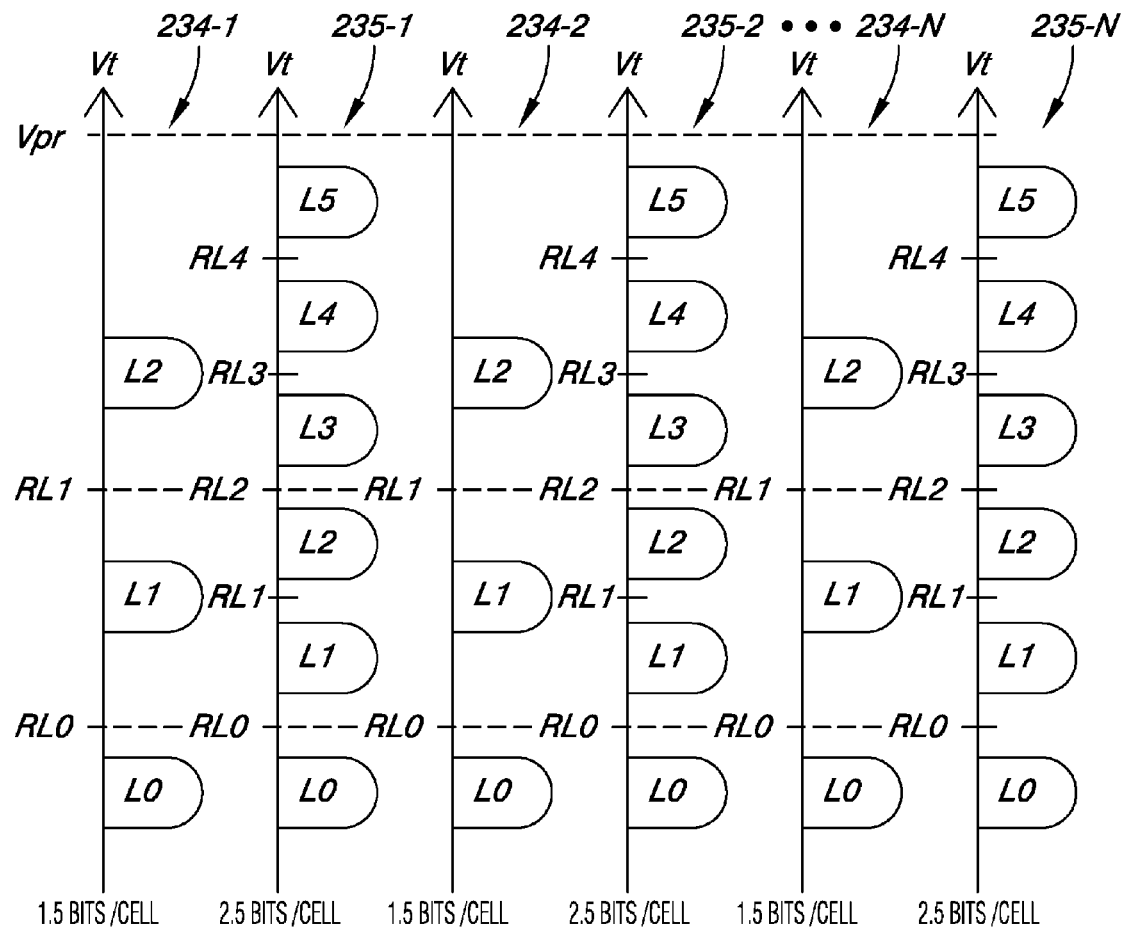
FIG. 2B illustrates threshold voltage distribution ranges and sensing voltage levels associated with cells having different numbers of digits in accordance with an embodiment of the present disclosure.

FIG. 2B illustrates threshold voltage distribution ranges and sensing voltage levels associated with cells having different numbers of digits in accordance with an embodiment of the present disclosure. The embodiment of FIG. 2B illustrates a number of threshold voltage (Vt) distribution ranges 234-1, 234-2, . . . , 234-N which correspond to cells 202 coupled to respective even sense lines, e.g., bit lines, 232-1, 232-2, . . . , 232-N. The Vt distribution ranges 235-1, 235-2, . . . , 235-N correspond to cells 203 coupled to respective odd sense lines 233-1, 233-2, . . . , 233-N. The even sense line Vt distribution ranges 234-1, 234-2, . . . , 234-N correspond to cells 202 having three program states, e.g., Vt distributions L0, L1, and L2 as shown. The even sense line Vt distribution ranges 234-1, 234-2, . . . , 234-N also correspond to cells 202 having two sensing voltage levels RL0 and RL1 as shown. The odd sense line Vt distribution ranges 235-1, 235-2, . . . , 235-N correspond to odd sense line cells 203 having six program states, e.g., Vt distributions L0, L1, L2, L3, L4, and L5 as shown. The odd sense line Vt distribution ranges 235-1, 235-2, . . . , 235-N also correspond to cells 203 having five sensing voltage levels RL0, RL1, RL2, RL3, and RL4 as shown. All cells can share a common pass-read voltage level Vpr as shown. A pass-read voltage level can be used to place any cell in a conducting state. A pass-read voltage can be applied to a number of cells coupled to a sense line that are not selected for sensing during a sensing operation such that the threshold voltage level of a cell selected for sensing may be determined.

The even sense line cells 202 can be programmed such that the Vt of the cell 202 is within one of the three Vt distributions L0, L1, and L2 associated with the distribution ranges 234-1, 234-2, . . . , 234-N. Similarly, the odd sense line cells 203 can be programmed such that the Vt of the cell 203 is within one of the six Vt distributions L0, L1, L2, L3, L4, and L5 associated with the distribution ranges 235-1, 235-2, . . . , 235-N. The even and odd sense line cells can be sensed using the sensing voltage level above the Vt distribution selected for sensing, e.g., sensing voltage level RL1 can be used to sense Vt distribution L1. As the reader will appreciate, the L0 state can be referred to as an erased state or as a lowermost program state. In operation, memory cells 202 and 203 can be placed in the L0 erase state prior to being programmed to one of their respective states.

As shown in FIG. 2B, the Vt distribution ranges 234-1, 234-2, . . . , 234-N correspond to cells 202 representing 1.5 digits/cell and the Vt distribution ranges 235-1, 235-2, . . . , 235-N correspond to cells 203 representing 2.5 digits/cell. The number of states to which a given memory cell 202/203 can be programmed corresponds to a number of digits storable by the given cell. In the embodiment shown in FIG. 2B, each of the cells 202 and 203 have a non-integer number of digits. For instance, the even sense line cells 202 are 1.5 digit cells, e.g., the three program states associated with the cells 202 can represent 1.5 digits of stored data. The odd sense line cells 203 are 2.5 digit cells, e.g., the six program states associated with the cells 203 can represent 2.5 digits of stored data. Embodiments are not limited to the examples shown in FIGS. 2A and 2B.

For instance, the even and odd sense line cells can have different program states and different corresponding numbers of digits. In some embodiments, the even sense line cells 202 are programmable to six states, e.g., the cells 202 are 2.5 digit cells, and the odd sense line cells 203 are programmable to 12 states, e.g., the cells 203 are 3.5 digit cells. In some embodiments, the even sense line cells 202 are programmable to three states, e.g., the cells 202 are 1.5 digit cells, and the odd sense line cells 203 are programmable to 24 states, e.g., the cells 203 are 4.5 digit cells. Embodiments of the present disclosure are not limited to memory cells having non-integer numbers of digits. For instance, in some embodiments, the even and/or odd sense line cells can be 2 digit, 3 digit, 4 digit, or 5 digit cells programmable to 4 states, 8 states, 16 states, or 32 states, respectively.

As illustrated in the embodiment of FIG. 2B, the even sense line cells 202 have a lesser number of program states and sensing voltage levels than the odd sense line cells 203. As is also illustrated in the embodiment of FIG. 2B, the sensing voltage level RL1 used to sense the first program state L1 above the lowermost program state L0 for even numbered cells 202 is equal to the sensing voltage level RL2 used to sense the second program state L2 above the lowermost program state L0 for odd numbered cells 203. Using common sensing voltage levels between cells programmed with different numbers of program states can improve read performance by reducing the number of read cycles and simplifies the circuitry necessary to control a non-volatile memory device coupled to such an array.

The program margin, e.g., the voltage difference between adjacent states (not labeled in FIG. 2B for ease of illustration) is smaller for cells having more program states. Conventionally, program margins are evenly spaced between Vt distribution ranges for a given cell. However, according to some embodiments of the present disclosure, certain program margins are adjusted, e.g., moved up or down, in order for cells with different digit values and numbers of program states to be sensed with a common sensing voltage level, e.g., RL1/RL2 in FIG. 2B.

In some embodiments of the present disclosure, data stored by adjacent sense line cells 202 and 203 can be combined in response to a data retrieval request received from a processor or external host associated with the array of non-volatile memory cells. For instance, in the embodiment illustrated in FIG. 2B, data stored by a cell 202 having 1.5 digits/cell can be combined with data stored by an adjacent cell 203 having 2.5 digits/cell such that the combined adjacent cells 202 and 203 represent 4 total logical digits, e.g., 1.5+2.5 digits.

For example, in the embodiment illustrated in FIG. 2B, a pair of adjacent cells e.g., a 1.5 digit cell 202 having three program states and a 2.5 digit cell 203 having six program states, can be mapped to four digits. In such embodiments, an adjacent three-state cell 202 and six-state cell 203 have eighteen possible combined states, e.g., the combined cells 202 and 203 can be mapped to sixteen program states representing four digits and two extra states.

In some embodiments, the even and odd sense lines can be sensed together to retrieve data from a selected select line, e.g., word line, 205. In such embodiments, the cells 202 coupled to sense lines 232-1, 232-2, . . . , 232-N and the cells 203 coupled to sense lines 233-1, 233-2, . . . , 233-N can represent two logical pages of data associated with the selected select line 205. As one of ordinary skill in the art will appreciate, a logical page associated with a particular select line can include a number of logical sectors each representing 512 bytes of data, for example. Embodiments are not limited to a particular logical page size, logical sector size, or to a particular number of logical pages and/or sectors associated with a particular select line, e.g., select line 205.

Figures 3A, 3B:
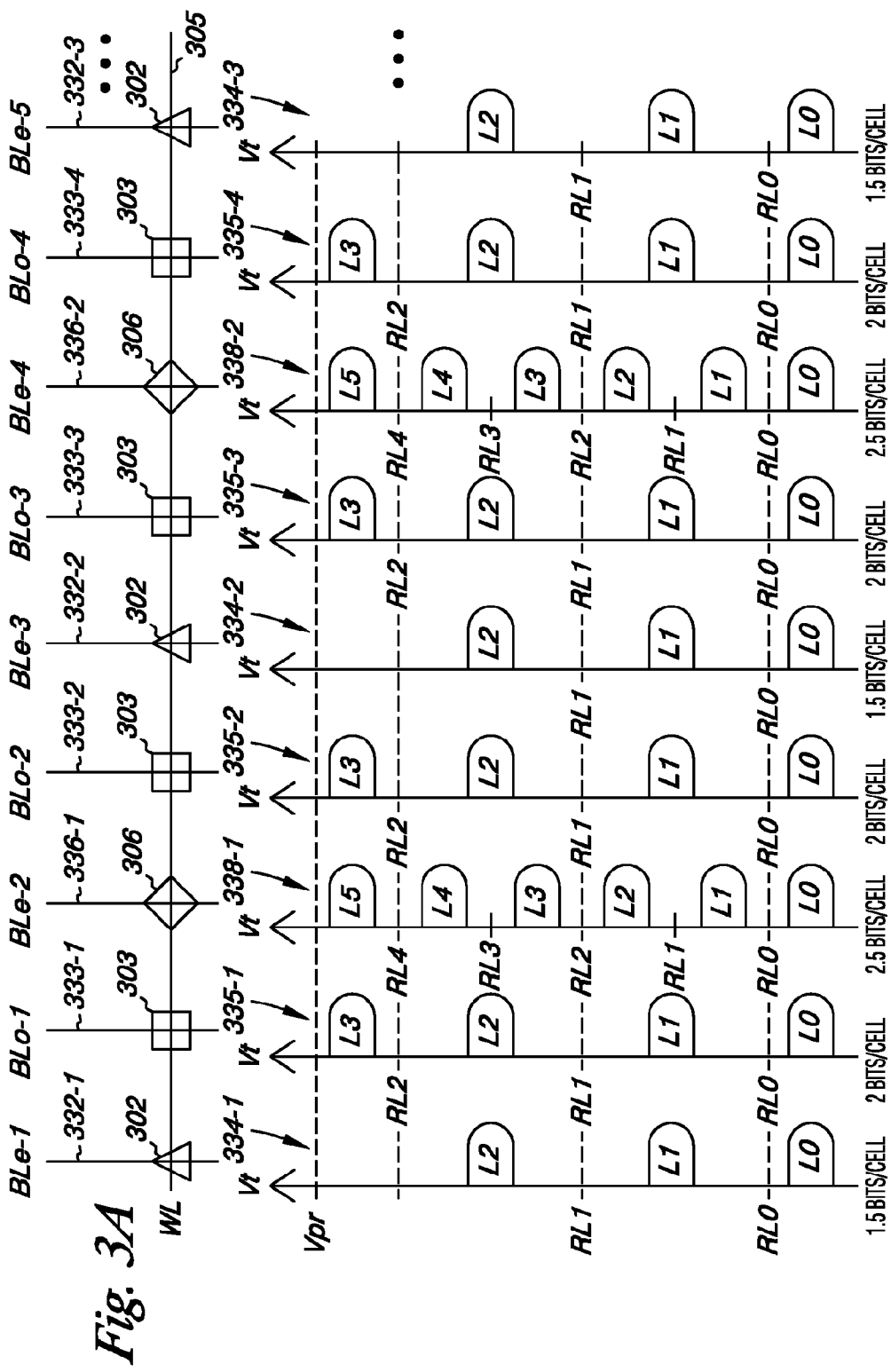
FIG. 3A illustrates a number of cells having different numbers of digits coupled to a select line in accordance with an embodiment of the present disclosure.
FIG. 3B illustrates threshold voltage distribution ranges and sensing voltage levels associated with cells having different numbers of digits in accordance with an embodiment of the present disclosure.

FIG. 3A illustrates a number of cells having different numbers of digits coupled to a select line in accordance with an embodiment of the present disclosure. The embodiment shown in FIG. 3A illustrates a number of cells 302/303/306 coupled to a select line, e.g., word line, (WL) 305. As shown in FIG. 3A, the cells 302 are coupled to a first subset of even numbered sense lines, e.g., bit lines, 332-1 (BLe-1), 332-2 (BLe-3), and 332-3 (BLe-5). While five sense lines are shown for ease of illustration, embodiments are not so limited. The cells 306 are coupled to a second subset of even numbered sense lines 336-1 (BLe-2) and 336-2 (BLe-4). The cells 303 are coupled to odd numbered sense lines 333-1 (BLo-1), 333-2 (BLo-2), 333-3 (BLo-3), and 333-4 (BLo-4). The pattern of cells 302/303/306 coupled to select line 305 continues on a sense line by sense line basis with a cell 303 coupled between an adjacent cell 302 and an adjacent cell 306. That is, the odd sense line cells 303 are interwoven among adjacent alternating even sense line cells 302 and 306 along select line 305.

As the reader will appreciate, the sense lines can be coupled to sensing circuitry (not shown) that can be used to determine the Vt level of cells 302/303/306 during operation. Although only one select line 305 is illustrated in the embodiment of FIG. 3A, embodiments can include any number of select lines, e.g., select lines 105-1 to 105-N shown in FIG. 1.

In the embodiment of FIG. 3A, the first subset of even sense line cells 302 are programmed together as a group, the second subset of even sense line cells 306 are programmed together as a group, and the odd sense line cells 303 are programmed together as a group. In some embodiments, the odd sense line cells 303 are sensed together as a group and correspond to an odd page of data associated with select line 305, while the even sense line cells 302 and 306 are sensed together and combined to correspond to an even page of data associated with select line 305.

FIG. 3B illustrates threshold voltage distribution ranges and sensing voltage levels associated with cells having different numbers of digits in accordance with an embodiment of the present disclosure. The embodiment of FIG. 3B illustrates a number of threshold voltage (Vt) distribution ranges 334-1, 334-2, and 334-3 which correspond to cells 302 coupled to respective even sense lines, e.g., bit lines, 332-1, 332-2, and 332-3. The Vt distribution ranges 338-1 and 338-2 correspond to cells 306 coupled to respective even sense lines 336-1 and 336-2. The Vt distribution ranges 335-1, 335-2, 335-3, and 335-4 correspond to cells 303 coupled to respective odd sense lines 333-1, 333-2, 333-3, and 333-4. The even sense line Vt distribution ranges 334-1, 334-2, and 334-3 correspond to cells 302 having three program states, e.g., Vt distributions L0, L1, and L2 as shown. The even sense line Vt distribution ranges 334-1, 334-2, and 334-3 also correspond to cells 302 having two sensing voltages RL0 and RL1 as shown. The even sense line Vt distribution ranges 338-1 and 338-2 correspond to cells 306 having six program states, e.g., Vt distributions L0, L1, L2, L3, L4, and L5 as shown. The even sense line Vt distribution ranges 338-1 and 338-2 also correspond to cells 306 having five sensing voltages RL0, RL1, RL2, RL3, and RL4 as shown. The odd sense line Vt distribution ranges 335-1, 335-2, 335-3, and 335-4 correspond to odd sense line cells 303 having four program states, e.g., Vt distributions L0, L1, L2, and L3 as shown. The odd sense line Vt distribution ranges 335-1, 335-2, 335-3, and 335-4 also correspond to odd sense line cells 303 having three sensing voltages RL0, RL1, and RL2 as shown.

All cells can share a common pass-read voltage level Vpr as shown. A pass-read voltage level can be used to place any cell in a conducting state. A pass-read voltage can be applied to a number of cells coupled to a sense line that are not selected for sensing during a sensing operation such that the threshold voltage level of a cell selected for sensing may be determined.

The even sense line cells 302 can be programmed such that the Vt of the cell 302 is within one of the three Vt distributions L0, L1, and L2 associated with the distribution ranges 334-1, 334-2, and 334-3. Similarly, the even sense line cells 306 can be programmed such that the Vt of the cell 306 is within one of the six Vt distributions L0, L1, L2, L3, L4, and L5 associated with the distribution ranges 338-1 and 338-2. The odd sense line cells 303 can be programmed such that the Vt of the cell 303 is within one of the four Vt distributions L0, L1, L2, and L3 associated with the distribution ranges 335-1, 335-2, 335-3, and 335-4. The even and odd sense line cells can be sensed using the sensing voltage level above the Vt distribution selected for sensing, e.g., sensing voltage level RL1 can be used to sense Vt distribution L1. The L0 state can be referred to as an erased state or as a lowermost program state. In operation, memory cells 302, 303, and 306 can be placed in the L0 erased state prior to being programmed to one of their respective states.

As shown in FIG. 3B, the Vt distribution ranges 334-1, 334-2, and 334-3 correspond to even sense line cells 302 representing 1.5 digits/cell, the Vt distribution ranges 338-1 and 338-2 correspond to even sense line cells 306 representing 2.5 digits/cell, and the Vt distribution ranges 335-1, 335-2, 335-3, and 335-4 correspond to cells 303 representing 2 digits/cell. The number of states to which a given memory cell 302/303/306 can be programmed corresponds to a number of digits storable by the given cell. In the embodiment shown in FIG. 3B, the even sense line cells 302 and 306 have a non-integer number of digits, e.g., 1.5 digits/cell and 2.5 digits/cell, respectively, while the odd sense line cells 303 have an integer number of digits, e.g., 2 digits/cell. In some embodiments, the number of digits for adjacent even sense line cells, e.g., an even sense line cell 302 and a cell 306 coupled to a next adjacent even sense line, sum to a number of digits that is twice the number of digits for an odd sense line cell 303. For example, in the embodiment illustrated in FIG. 3B, the number of digits for an even sense line cell 302, e.g., 1.5 digits/cell, and an even sense line cell 306, e.g., 2.5 digits/cell, sum to 4 digits/cell, which is twice the number of digits for an odd sense line cell 303, e.g., 2 digits/cell. Embodiments are not limited to the examples shown in FIGS. 3A and 3B.

In some previous sensing operation approaches, all odd sense line cells are sensed together as a group and all of the even sense line cells are sensed together as a group. In such prior approaches, the even sense line cells have the same number of program states as the odd sense line cells, e.g., the even and odd sense line cells have the same number of digits per cell. In contrast, in some embodiments of the present disclosure, a number of subsets of cells coupled to even and/or odd sense lines along a given select line can be separately sensed at different times. For example, as described in connection with the embodiment of FIG. 3A, a first subset of even sense line cells, e.g., 302, are sensed together prior to sensing a second subset of even sense line cells, e.g., 306. In the embodiment of FIG. 3A, the even sense line cells 302 represent cells coupled to half of the even sense lines, e.g., BLe-1, BLe-3, BLe-5, etc., associated with a given select line, and the even sense line cells 306 represent cells coupled to the other half of the even sense lines, e.g., BLe-2, Ble-4, etc., associated with the given select line, e.g., 305. Embodiments are not limited to sensing operations in which the cells of a given select line are divided into any particular number of subsets. For example, in some embodiments the even sense line cells and/or the odd sense line cells can be divided into more than two subsets.

As illustrated in the embodiment of FIG. 3B, the first subset of even sense line cells 302 have a lesser number of program states and sensing voltages than the odd sense line cells 303 and the second subset of even sense line cells 306. In the embodiment of FIG. 3B, the odd sense line cells 303 have a lesser number of program states and sensing voltages than the second subset of even sense line cells 306. As is also illustrated in the embodiment of FIG. 3B, the sensing voltage RL1 used to sense the first program state L1 above the lowermost program state L0 for the first subset of even numbered cells 302 is equal to the sensing voltage RL1 used to sense the first program state L1 above the lowermost program state L0 for odd numbered cells 303, and is also equal to the sensing voltage RL2 used to sense the second program L2 state above the lowermost program state L0 for the second subset of even numbered cells 306. Similarly, the sensing voltage RL2 used to sense the second program state L2 above the lowermost program state L0 for odd numbered cells 303 is equal to the sensing voltage used to sense the fourth program state L4 above the lowermost program state L0 for the second subset of even cells 306. Using common sensing voltage levels between cells programmed with different numbers of program states can improve read performance by reducing the number of read cycles and simplifies the circuitry necessary to control a non-volatile memory device including such an array.

The program margin between adjacent states (not labeled in FIG. 3B for ease of illustration) is smaller for cells having more program states. Conventionally, program margins are evenly spaced between Vt levels or a given cell. However, according to some embodiments of the present disclosure, certain program margins are adjusted, e.g., moving up or down, in order for cells with different digit values and numbers of program states to be sensed with a common sensing voltage level, e.g., RL2/RL4 in FIG. 3B.

In some embodiments of the present disclosure, data stored by adjacent odd sense line cells 303 are sensed out together as a group and can correspond to a logical page, e.g., an odd logical page, of data associated with a given select line 305. In such embodiments, the first subset of even sense line cells 302 and the second subset of even sense line cells 306 can also be sensed out together as a group and can correspond to a logical page, e.g., an even logical page, of data associated with a given select line 305. In embodiments in which the first subset of even sense line cells 302 and the second subset of even sense line cells 306 are read out together, the data stored by adjacent even sense line cells, e.g., cell 302 coupled to even sense line 332-1 and cell 306 coupled to even sense line 336-1, can be combined in response to a data retrieval request received from a processor or external host associated with the array of non-volatile memory cells. For instance, in the embodiment illustrated in FIG. 3B, data stored by an even sense line cell 302 having 1.5 digits/cell can be combined with data stored by an adjacent even sense line cell 306 having 2.5 digits/cell such that the combined adjacent even sense line cells 302 and 306 represent 4 total logical digits, e.g., 1.5+2.5 digits, or 2 digits/cell, as has been described in connection with FIGS. 3A and 3B.

In the embodiment illustrated in FIG. 3B, a pair of adjacent even sense line cells e.g., a 1.5 digit cell 302 having three program states and a 2.5 digit cell 306 having six program states, can be mapped to four digits. In such embodiments, the adjacent three-state cell 302 and six-state cell 306 have eighteen possible combined states, e.g., the combined cells 302 and 306 can be mapped to sixteen program states representing four digits and two extra states. In such embodiments, pairs of adjacent odd sense line cells, e.g., 2 digit cells 303 having four program states, can also be mapped to four digits such that the logical odd page size and the logical even page size associated with a selected select line are the same.

In the embodiment illustrated in FIG. 3A, the even sense lines coupled to cells 302 and the even sense lines coupled to cells 306 can be sensed together to retrieve data from a selected select line 305. The odd sense lines coupled to cells 303 can also be sensed together to retrieve data from the selected select line 305. In such embodiments, the data stored in the even sense line cells 302 and 306 of select line 305 represents a logical page of data and the data stored in the odd sense line cells 303 of select line 305 represents a different logical page of data.

Figure 4:
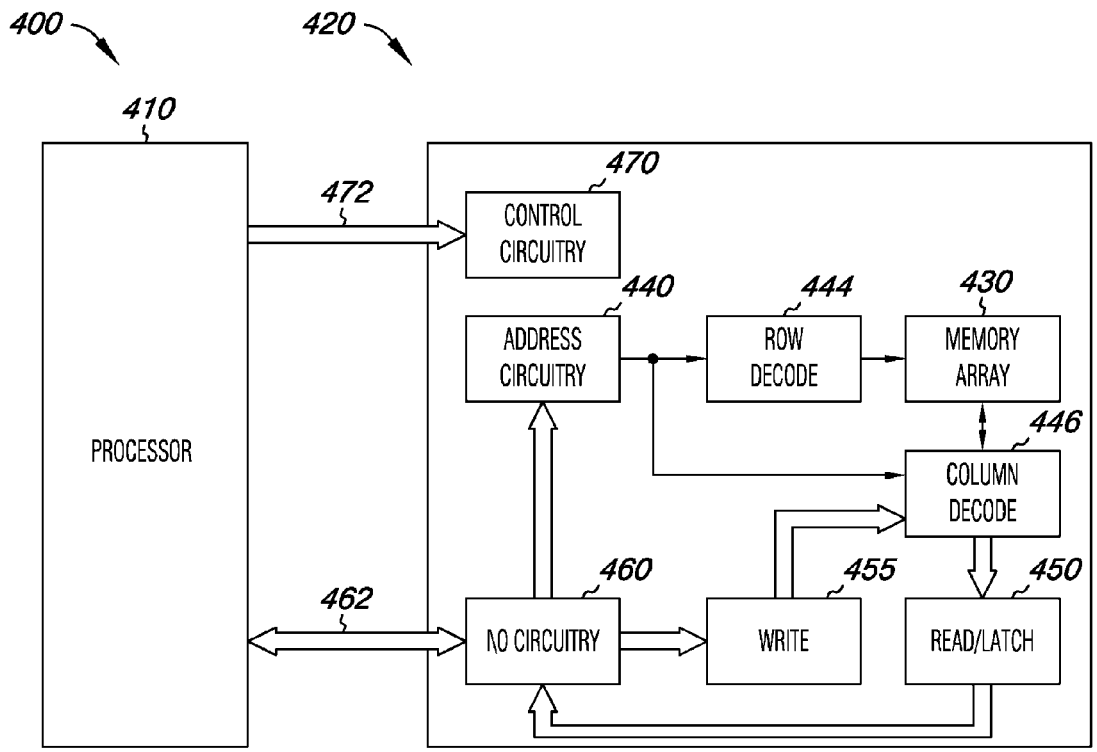
FIG. 4 is a functional block diagram of an electronic memory system having at least one memory device operated in accordance with an embodiment of the present disclosure.

FIG. 4 is a functional block diagram of an electronic memory system 400 having at least one memory device 420 operated in accordance with an embodiment of the present disclosure. Memory system 400 includes a processor 410 coupled to a non-volatile memory device 420 that includes a memory array 430 of multilevel non-volatile cells. The memory system 400 can include separate integrated circuits or both the processor 410 and the memory device 420 can be on the same integrated circuit. The processor 410 can be a microprocessor or some other type of controlling circuitry such as an application-specific integrated circuit (ASIC).

For clarity, the electronic memory system 400 has been simplified to focus on features with particular relevance to the present disclosure. The memory device 420 includes an array of non-volatile memory cells 430, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 4 includes address circuitry 440 to latch address signals provided over I/O connections 462 through I/O circuitry 460. Address signals are received and decoded by a row decoder 444 and a column decoder 446 to access the memory array 430. In light of the present disclosure, it will be appreciated by those skilled in the art that the number of address input connections depends on the density and architecture of the memory array 430 and that the number of addresses increases with both increased numbers of memory cells and increased numbers of memory blocks and arrays.

The memory array 430 of non-volatile cells can include non-volatile multilevel memory cells having different numbers of program states, common sensing voltages, and numbers of digits according to embodiments described herein. The memory device 420 senses data in the memory array 430 by sensing voltage and/or current changes in the memory array columns using sense/buffer circuitry that in this embodiment can be read/latch circuitry 450. The read/latch circuitry 450 can read and latch a page or row of data from the memory array 430. I/O circuitry 460 is included for bi-directional data communication over the I/O connections 462 with the processor 410. Write circuitry 455 is included to write data to the memory array 430.

Control circuitry 470 decodes signals provided by control connections 472 from the processor 410. These signals can include chip signals, write enable signals, and address latch signals that are used to control the operations on the memory array 430, including data sensing, data write, and data erase operations. In some embodiments, the control circuitry 470 is responsible for executing instructions from the processor 410 to perform the operating and programming according to embodiments of the present disclosure. The control circuitry 470 can be a state machine, a sequencer, or some other type of controller. It will be appreciated by those skilled in the art that additional circuitry and control signals can be provided, and that the memory device detail of FIG. 4 has been reduced to facilitate ease of illustration.

Figure 5:
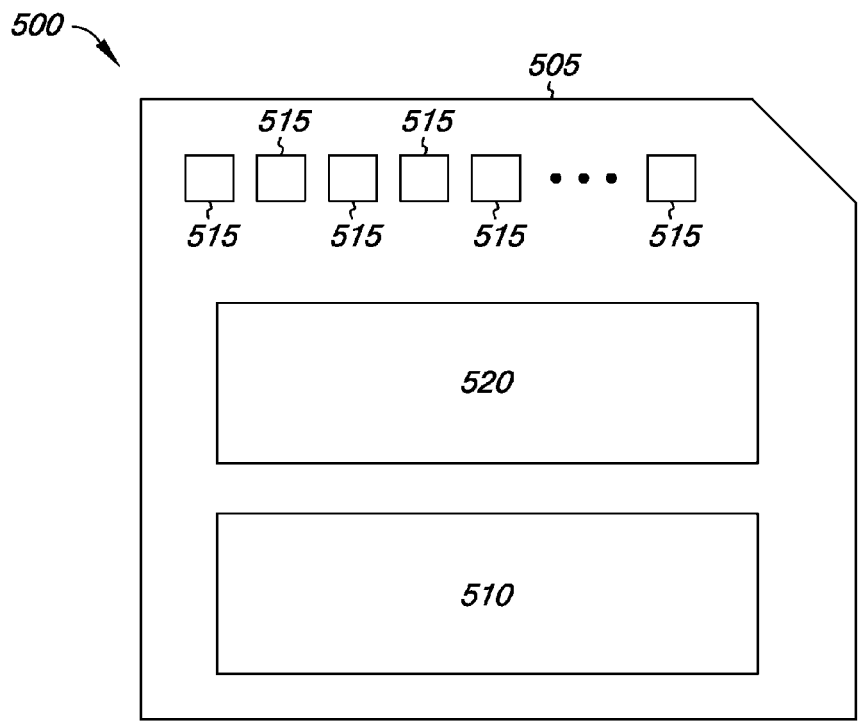
FIG. 5 is a functional block diagram of a memory module having at least one memory device in accordance with an embodiment of the present disclosure.

FIG. 5 is a functional block diagram of a memory module having at least one memory device programmed in accordance with an embodiment of the present disclosure. Memory module 500 is illustrated as a memory card, although the concepts discussed with reference to memory module 500 are applicable to other types of removable or portable memory (e.g., USB flash drives) and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 includes an array of non-volatile multilevel memory cells that can be sensed according to embodiments described herein. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520, which may be one or more integrated circuits and/or discrete components. For some embodiments, the additional circuitry 520 may include control circuitry, such as a memory controller, for controlling access across multiple memory devices 510 and/or for providing a translation layer between an external host and a memory device 510. For example, there may not be a one-to-one correspondence between the number of contacts 515 and a number of 510 connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC. Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

Methods, devices, modules, and systems for operating memory cells have been shown. One method embodiment includes programming at least one of the memory cells to one of a number of states. The method also includes programming at least another one of the memory cells, which is adjacent to the programmed at least one of the memory cells, to one of a different number of states. The method further includes sensing non-erased states of the memory cells using at least one common voltage level.

Although specific embodiments have been illustrated and described herein, those of ordinary skill in the art will appreciate that an arrangement calculated to achieve the same results can be substituted for the specific embodiments shown. This disclosure is intended to cover adaptations or variations of some embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the some embodiments of the present disclosure includes other applications in which the above structures and methods are used. Therefore, the scope of some embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of memory cells, comprising:
    programming a first memory cell of a first subset of cells to one of a first number of states, wherein the first subset of cells are programmable to the first number of states;
    programming a second memory cell, located adjacent to the programmed memory cell in the array, to one of a second number of states, wherein the second memory cell is one of a second subset of cells programmable to the second number of states; and
    sensing different non-erased states of the first and the second memory cells using at least one common voltage level.

2. The method of claim 1, wherein the method includes:
    programming at least one memory cell of the first subset of cells to one of three states; and
    programming at least another memory cell of the second subset of cells to one of six states.

3. The method of claim 2, wherein the method includes:
    using at least one of two sensing voltages to sense the at least one memory cell programmed to one of three states; and
    using at least one of five sensing voltages to sense the at least another memory cell programmed to one of six states.

4. The method of claim 3, wherein the method includes using at least two common sensing voltages for the at least one and at least another memory cells.

5. The method of claim 1, wherein the method includes:
    programming at least one memory cell of the first subset of cells to one of six states;
    programming at least another memory cell of the second subset of cells to one of four states; and
    using at least two common voltage levels to sense at least two different non-erased states of the memory cells.

6. A method for operating an array of memory cells, the method comprising:
    programming a first memory cell coupled to a select line to one of a first number of states, wherein the first memory cell is one of a first subset of cells programmable to the first number of states;
    programming a second memory cell coupled to the select line to one of a second number of states, the second number of states being greater in number than the first number of states, wherein the second memory cell is one of a second subset of cells programmable to the second number of states; and
    sensing a non-erased state of the first memory cell and a different non-erased state of the second memory cell using a common sensing voltage.

7. The method of claim 6, wherein the method includes sensing an erased state at a common voltage level for the first and second memory cells.

8. The method of claim 6, wherein the method includes applying a common pass-read voltage level for the first and second memory cells.

9. The method of claim 6, wherein the method includes:
    programming the first memory cell to a second of three states;
    programming the second memory cell to a third of six states; and
    sensing the first and second memory cells using a common sensing voltage.

10. The method of claim 9, wherein the method includes:
    programming a third memory cell on the select line to a second of four states, wherein the third memory cell is one of a third subset of memory cells programmable to a third number of states; and
    sensing the first, second, and third memory cells using a common sensing voltage.

11. A method for operating memory cells, comprising:
    programming a first number of cells on a first page to one of a first number of states, wherein the first number of cells belong to a first subset of cells programmable to the first number of states;
    programming a second number of cells on a second page to one of a second number of states, wherein the second number of cells belong to a second subset of cells programmable to the second number of states; and
    sensing the first and second numbers of cells using a sensing voltage for each state, wherein at least one common sensing voltage is used to sense one of the first number of states and a different one of the second number of states.

12. A memory device comprising:
    an array of memory cells arranged in rows and columns, wherein the cells arranged in one of the rows are coupled by a select line and wherein the cells arranged in one of the columns are coupled by a sense line; and
    control circuitry coupled to the array, wherein the control circuitry is operable to:
        program a first memory cell coupled to a select line to one of a first number of states, wherein the first memory cell is one of a first subset of cells programmable to the first number of states;
        program a second memory cell coupled to the select line to one of a second number of states, the second number of states being greater in number than the first number of states, wherein the second memory cell is one of a second subset of cells programmable to the second number of states; and sense a non-erased state of the first memory cell and a different non-erased state of the second memory cell using a common sensing voltage.

13. The device of claim 12, wherein cells coupled to the select line are arranged in alternating memory cells of the first subset and memory cells of the second subset.

14. The device of claim 12, wherein the control circuitry is operable to:

program a third memory cell coupled to the select line to one of a third number of states, wherein the third memory cell is one of a third subset of cells programmable to the third number of states; and sense different non-erased states of the first, second, and third subsets of memory cells using a common sensing voltage.

15. The device of claim 14, wherein the third number of states is greater than the first number of states and less than the second number of states.

16. The device of claim 14, wherein the control circuitry is operable to sense a same non-erased state of the first and third subsets of cells and a different non-erased state of the second subset of cells with a common sensing voltage.

17. The device of claim 14, wherein cells coupled to the select line are arranged in a repeating pattern of: memory cell of the first subset, memory cell of the third subset, memory cell of the second subset, memory cell of the first subset.

18. The device of claim 12, wherein the control circuitry is operable to use a different number of voltages to sense a memory cell of the first subset than a memory cell of the second subset.

19. An electronic system, comprising:

a processor; and a memory device coupled to the processor, the memory device comprising:

at least one array of memory cells including a first subset of cells programmable to a first number of states and a second subset of cells programmable to a second number of states; and control circuitry coupled to the array and configured to sense a number of cells using a common sensing voltage, where the common sensing voltage is used to sense different states for the first and the second subsets of cells programmable to different numbers of states.

20. The system of claim 19, wherein memory cells are arranged along at least one select line alternating between the first and second subsets.

21. The system of claim 19, wherein the control circuitry is configured to program the first subset of cells to the first number of states such that program margins between the first number of states are not equal.

22. The system of claim 21, wherein the control circuitry is configured to program the second subset of cells to the second number of states including program margins between the states sufficient to allow the common sensing voltage to be used to sense a state from the first subset of cells and a different state from the second subset of cells.

23. The system of claim 19, wherein the control circuitry is configured to use a common pass-read voltage for all cells in the array.

24. The system of claim 19, wherein the control circuitry is configured to use a common sensing voltage for a lowermost program state for all cells in the array.

* * * * *

UNITED STATES PATENT AND TRADEMARK OFFICE
CERTIFICATE OF CORRECTION

PATENT NO. : 7,843,735 B2  Page 1 of 1
APPLICATION NO. : 11/931763
DATED : November 30, 2010
INVENTOR(S) : Seiichi Aritome It is certified that error appears in the above-identified patent and that said Letters Patent is hereby corrected as shown below:

Title page, Item (57), under "Abstract", line 8, delete "cell's" and insert -- cells --, therefor.

Signed and Sealed this
Eighth Day of February, 2011

David J. Kappos
*Director of the United States Patent and Trademark Office*